United States Patent [19]

Ibbotson et al.

[11] Patent Number: 4,689,115
[45] Date of Patent: Aug. 25, 1987

[54] GASEOUS ETCHING PROCESS

[75] Inventors: Dale E. Ibbotson, Westfield; Charles W. Tu, Bridgewater, both of N.J.

[73] Assignee: American Telephone and Telegraph Company, AT&T Bell Laboratories, Murray Hill, N.J.

[21] Appl. No.: 727,669

[22] Filed: Apr. 26, 1985

[51] Int. Cl.⁴ .................... H01L 21/306; B44C 1/22; C03C 15/00; C03C 25/06
[52] U.S. Cl. .................. 156/646; 437/905; 156/626; 156/648; 156/655; 156/662; 252/79.1; 357/16; 357/42
[58] Field of Search .............. 204/192 E; 29/569 L, 29/580, 571; 357/16, 17, 41–43, 55; 252/79.1; 156/643, 646, 648, 655, 659.1, 662, 626

[56] References Cited

U.S. PATENT DOCUMENTS

| | | | |
|---|---|---|---|
| 3,923,569 | 12/1975 | Ono et al. | 156/646 |
| 4,285,763 | 8/1981 | Coldren | 156/646 X |
| 4,397,711 | 8/1983 | Donnelly et al. | |
| 4,498,953 | 2/1985 | Cook et al. | |

Primary Examiner—William A. Powell
Attorney, Agent, or Firm—Walter G. Nilsen

[57] ABSTRACT

A process is described for preparing III-V compound semiconductor devices (e.g., gallium arsenide devices) in which gaseous bromine or chlorine is used as an etch. This etch procedure provides highly uniform etching. High selectivity for etching gallium arsenide in the presence of gallium aluminum arsenide may be obtained by the addition of oxidant gas such as water vapor.

12 Claims, 2 Drawing Figures

4,689,115

GASEOUS ETCHING PROCESS

TECHNICAL FIELD

The invention is a process for making semiconductor devices and devices made by such a process.

BACKGROUND OF THE INVENTION

Great advances have been made in the last few years in semiconductor technology both in terms of new materials, new fabrication techniques and new semiconductor device structures. For example, geometrical features have become smaller, packing densities have become greater and fabrication techniques have improved.

This has been particularly true in the field of III-V semiconductor compound devices. Such devices promise greater speed in electronic circuits such as memories and logic circuits as well as greater bandwidth in amplifier circuits. Also, III-V semiconductor compounds are used in such optical devices as photodetectors, light-emitting diodes and lasers.

Particularly useful for such a developing technology are various fabrication procedures which are highly specific to certain materials and/or highly controlled so as to produce geometrical shapes with small dimensions. Indeed, small size and high packing density are highly desirable in many applications because it produces more functions per unit of chip area (large memories, logic circuits, etc.) and these desirable features require accurate, precise fabrication techniques.

A particular case in point is etching techniques used in fabricating devices with III-V semiconducting compounds. Here, uniform etching is desirable as well as high selectivity where one compound is to be etched in the presence of another compound. A typical plasma etching procedure for III-V semiconductor compounds is described in U.S. Pat. No. 4,397,711, issued to V. M. Donnelly et al, on Aug. 9, 1983.

Gaseous etching without a plasma is highly advantageous in a number of applications, particularly with semiconductor devices. Some of these advantages are minimum surface damage, better selectivity, simple to carry out and potential to etch a large number of devices simultaneously. Some of these advantages are discussed in U.S. Pat. No. 4,498,953, issued to J. M. Cook et al, on Feb. 12, 1985.

SUMMARY OF THE INVENTION

The invention is a process for making a device comprising one or more III-V semiconductor compounds in which bromine or chlorine gas is used to etch at least one III-V compound semiconductor in the absence of any external excitation. The etching is generally carried out at a reduced pressure, preferably from 0.1 to 20 millitorrs (mTorrs) with 1–10 mTorrs most preferred. Temperature may vary over a large range. Temperature is often adjusted to provide a convenient etch rate in the fabrication process. High temperature limits are often set to avoid damage to the device being fabricated or damage to materials (e.g., photoresist) used in the fabrication procedure. Often, the process is carried out to effect etching of one III-V semiconductor compound without etching another III-V semiconductor compound also exposed to the same procedure. Typical examples are etching GaAs in the presence of GaAlAs or etching InP in the presence of InGaAs. Often the addition of a gaseous oxidant in the presence of bromine or chlorine gas provides high selectivity. Typical gaseous oxidants are oxygen, water vapor and other entities that can oxidize exposed surfaces. The procedure is useful in fabricating a number of devices including selectively doped heterojunction transistors (SDHTs), other heterostructure devices, various field-effect transistor type devices (FETs) and quantum-well optical devices. The procedure is simple, requiring only exposure to gaseous bromine or chlorine, does not involve exposure of the sample to plasmas or aqueous solutions and can easily be monitored in-situ using conventional optical or interferometric procedures.

DETAILED DESCRIPTION

Figure 1:
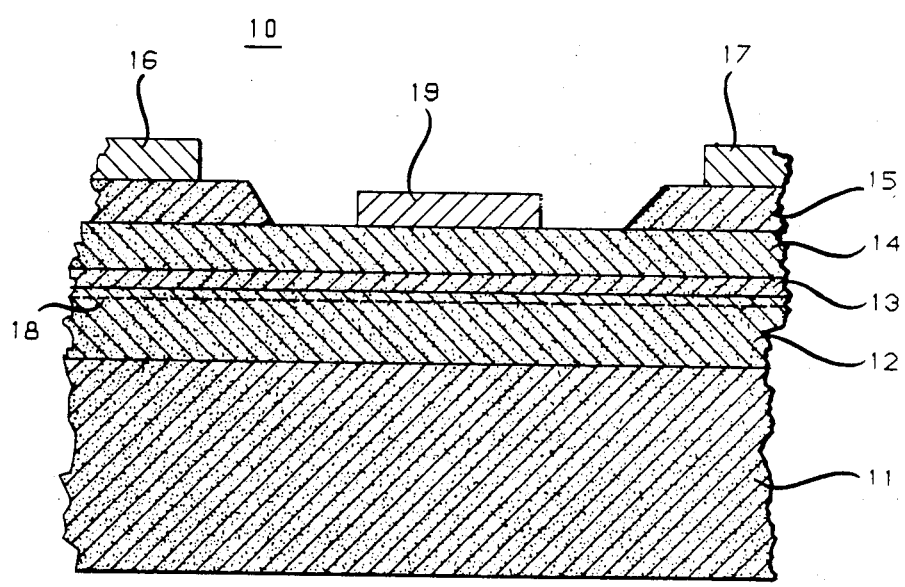
FIG. 1 shows a side view of a semiconductor structure, a selectively doped heterostructure transistor.

The invention is based on the discovery that gaseous chlorine or bromine, particularly at low pressures, provides a particularly uniform etchant for a number of III-V semiconductor compounds (e.g., GaAs). The gaseous bromine or chlorine provides uniform etching over a wide area (e.g., over a wafer with diameter of 50 mm or larger). Also included is a mixture of chlorine and bromine as the etchant gas.

Also gaseous bromine or chlorine under certain conditions provides highly selective etching in that it etches one III-V compound semiconductor while not attacking another III-V compound semiconductor exposed to the same conditions. Generally, bromine gas is preferred because of more controlled etching and smoother surfaces produced. Generally, highly selective etching requires the presence of an oxidant gas (in addition to the bromine). Typical oxidant gases are oxygen, water vapor, etc. Under appropriate conditions, gaseous bromine or chlorine etches gallium arsenide in the presence of gallium aluminum arsenide. Generally, at least about 5 mole percent aluminum in gallium aluminum arsenide is necessary to show etching selectivity. However, most practical interset is in aluminum contents over about 10 mole percent, for example, $Al_{0.3}Ga_{0.7}As$. Here, extremely high etch selectivity is possible using reduced pressure gaseous bromine and an oxidant gas.

Other systems of interest are the etching of InP in the presence of AlInAs or the etching of InP in the presence of GaInAs. Again, interest is generally in aluminum or indium contents greater than about 5 mole percent in the tertiary compound but most interest is centered on the composition (e.g., $Ga_{0.47}In_{0.53}As$ or $Al_{0.47}In_{0.53}As$) that is lattice-matched to InP.

Although the temperature may vary over a wide range, generally the temperature is adjusted to yield convenient etch rates and ensure stability of device features and fabrication materials such as photoresists, etc. Generally, the preferred temperature range is from about 60–200 degrees C. with 60–140 degrees C. preferred where conventional photoresist material is used. Higher temperatures may be used where the photoresist can withstand such higher temperatures as other type material is used as the mask. Optimum conditions, particularly where gallium arsenide etching is involved, are in the temperature range from 100–110 degrees C.

Optimum conditions of bromine or chlorine pressure and oxidant gas pressure often depend on the III-V compound semiconductor being etched and whether or not selectivity is desired.

Generally speaking, bromine or chlorine pressure may vary from about 0.1 mTorrs to about 100 mTorrs. Above 100 mTorrs, etching still takes place but uniformity is reduced. Often, if uniformity is not critical and etching rate is at a premium, pressures above 100 mTorrs may be used. Below a pressure of about 0.1 mTorrs, etching rate is often inconveniently slow for many applications. The pressure range from 1 to 10 mTorrs usually provides the best compromise between etching speed and etching uniformity.

Where etching selectivity is of primary concern, an oxidant gas is used. Gaseous $H_2O$ is a particularly convenient oxidant gas. For etching gallium arsenide in the presence of gallium aluminum arsenide, a bromine pressure between 1-10 mTorrs and water vapor pressure between 0.1 and 2 mTorrs is preferred. More preferred is a bromine pressure of 1 mTorrs ±50 percent and water vapor pressure of 0.5 mTorrs 35 50 percent. Often, an inert carrier gas is used (e.g., helium, argon, etc.) so that the above pressures are partial pressures in the inert carrier gas. Indeed, the water vapor is conveniently introduced into the etching chamber using a carrier gas bubbled through water at a temperature and under conditions so that the correct vapor pressure of water vapor is produced.

It should be remarked that for many applications, the layers being etched are very thin, often less than 5000 Angstroms or even 1000 Angstroms. Given below are a number of applications of the bromine gas etching process.

FIG. 1 shows a side view of a selectively doped heterostructure 10 usefully made in accordance with the inventive process. This Figure shows the finished device. It usually makes up a portion of a wafer with many similar devices on the same wafer. The device is made on a semiinsulating gallium arsenide substrate 11 with a number of layers grown on top of the substrate. These layers are undoped gallium arsenide 12, with a thickness of about 1 μm, and undoped layer 13 of AlGaAs (typical composition $Al_{0.3}Ga_{0.7}As$) with a thickness of about 20-80 Angstrom units, a heavily doped layer 14 of n+ AlGaAs with a typical thickness of about 350-500 Angstroms and a heavily doped layer 15 of n+ GaAs. Both the n+ AlGaAs layer 14 and the n+ GaAs layer 15 are doped with silicon; the former usually to the doping concentration of $1-2 \times 10^{18}$ cm$^{-3}$ and the latter to a doping concentration of about $2 \times 10^{18}$ cm$^{-3}$.

A particular advantage of this type of structure is the presence of a two-dimensional electron gas in the undoped portion of the gallium arsenide epitaxial layer. This is shown by a dotted line 18 in FIG. 1.

Before the etching step with bromine and oxidant gas, the source electrode 16 and drain electrode 17 are in place. The n+ GaAs layer 15 extends across the entire wafer and photolithographic techniques are used to delineate the area where the n+ GaAs is to be etched away to provide for the gate electrode to be placed on the n AlGaAs layer.

Prior to etching, the surface is cleaned (principally to remove native oxide) typically in a 1:1 aqueous HCl for 30 seconds, rinsed in deionized water and blown dry in nitrogen gas. The sample was then placed in the reactor which was evacuated to a base pressure <0.5 mTorrs prior to admitting the feed gases. This initial pumpdown also allowed the sample to thermally equilibrate with the electrode. For conditions excluding oxidants $BCl_3$ (2-5 mTorrs) was admitted to the reactor for several minutes prior to introducing $Br_2$ in order to scavenge residual $H_2O$. For stopetch conditions such as desired here oxidant ($O_2$ or $H_2O$) was flowed at least 2 min prior to introducing $Br_2$. At the end of the reaction the flows were terminated in reverse order, the reactor was evacuated to less than 1 mTorrs, isolated, and then pressurized with $N_2$ to 1 atm for sample transfer.

Laser interferometry provides a convenient in-situ technique for monitoring etch depth and endpoint for low pressure gaseous etching applied to heterostructure layers. GaAs and $Al_xGa_{1-x}As$ are partially transparent to the 6328 Angstroms He/Ne laser probe so that intensity modulation occurs due to changes in the thickness of the top layer and interference between the surface and the $GaAs/Al_xGa_{1-x}As$ interface. Moreover, endpoint is easily detected as a layer is cleared due to differences between the index of refraction $n(x, \lambda)$ of the layers, which is a function of the wavelength $\lambda$ (constant here) and the mole fraction of Al, x.

The etching process is carried out at a temperature between 100 and 110 degrees C. and a bromine pressure of about 1 mTorrs and a water vapor pressure of about 0.5 mTorrs. Generally, an inert carrier gas is used to provide a vehicle for the water vapor and to insure rapid replacement of etchant gas. The etching process is monitored by the laser interferometer described above.

After etching away the gallium arsenide to produce the gate window, the gate electrode 19 is put down by conventional techniques.

Figure 2:
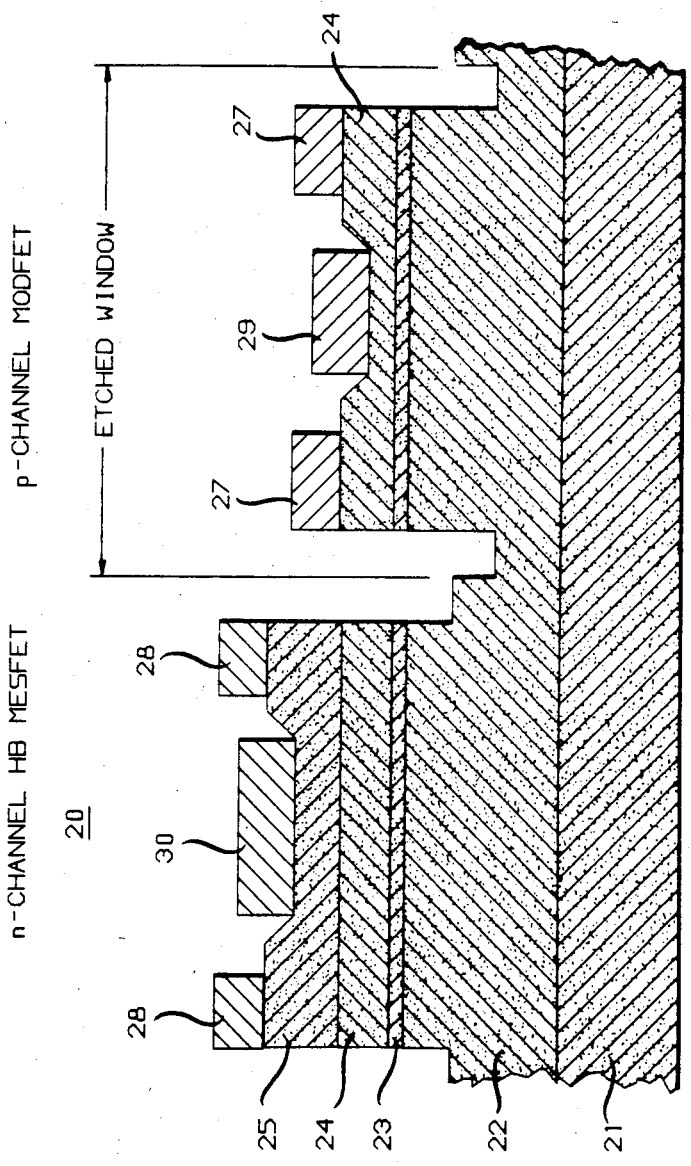
FIG. 2 shows a side view of a semiconductor structure, a complementary transistor structure.

FIG. 2 shows another example of where the etch process described above is usefully employed in the fabrication procedure. The structure is a complementary transistor structure with a p-channel modulation doped FET (p-MODFET) together with an n-channel MESFET (metal-semiconductor field-effect transistor) in which electrons are confined by an n-p heterojunction barrier (n-HB MESFET). The structure 20 shown in FIG. 2 is essentially divided into two parts, the n-channel HB MESFET and the p-channel MODFET. A large number of these complimentary circuits are contained on one wafer (even on one chip). Initially, the wafer is made up of a semi-insulating GaAs substrate 21 with successive layers as follows: a buffer layer 22 (about 1 μm thick) of undoped gallium arsenide, a spacer layer 23 (about 80 Angstroms thick) of undoped aluminum gallium arsenide (e.g., $Al_{0.6}Ga_{0.4}As$), a layer 24 of p-$Al_{0.6}Ga_{0.4}As$ (about 480 Angstroms thick doped with Be to a doping concentration of about $2 \times 10^{18}$ cm$^{-3}$) and a top layer 25 of n-GaAs, doped with silicon to a concentration of about $1 \times 10^{17}$ cm$^{-3}$ for a thickness of 3400 Angstroms and a concentration of $2 \times 10^{18}$ cm$^{-3}$ for a thickness of about 600 Angstroms. Initially, the entire wafer is covered with these layers.

Fabrication is begun by etching windows in the p-channel MODFET by removing the gallium arsenide without affecting the AlGaAs layer. This is done using a bromine gas etch with oxidant gas as described above.

Followig fabrication of the windows, mesas 26 for both the n-channel and p-channel FETs are patterned with a single mask and defined by chemical etching. Next, a AuBe-based p-type Ohmic contact metallization 27 is deposited and alloyed at 450 degrees C. for 2 min. This is followed by the deposition of a AuGe-based n-type contact layer 28, which is alloyed at 420 degrees C. for 15 sec. Next, the gates 29 for the p-MODFETs are patterned and chemically recessed using a 2:10:100 $H_2O_2:H_2PO_4:H_2O$ solution. A Ti/Au gate metallization is used. Finally, the n-HB MESFET gates 30 are formed by the same process. Conventional optical contact lithography is employed throughout the process and all metal features are defined by direct lift-off. The gate length and source-drain spacing in the FETs are 2 and 5 μm, respectively. The width of the gate ranged from 10 to 100 μm.

Another application is to the fabrication of MESFETs. Particulartly advantageous is in-situ monitoring of the electrical characteristics of the semiconductor structure. For example, the source to drain current is monitored during etching to adjust threshold voltage of the device.

What is claimed is:

1. A process for fabricating a semiconductor device comprising at least one III-V semiconductor compound in which at least one of the III-V semiconductor compounds is etched by a non-plasma etching procedure using an etchant gas characterized in that the etchant gas comprises at least one gas selected from the group consisting of chlorine gas and bromine gas with a pressure between 0.1 and 100 millitorrs.

2. The process of claim 1 in which the etchant gas pressure is between 1 and 10 millitorrs.

3. The process of claim 1 in which the temperature of the surface being etched is between 60 and 200 degrees C.

4. The process of claim 3 in which the temperature range is between 60 and 140 degrees C.

5. The process of claim 4 in which the temperature range is between 100 and 110 degrees C.

6. The process of claim 1 in which a first III-V semiconductor compound is etched in the presence of one or more second III-V semiconductor compounds characterized in that the etchant further comprises an oxidant gas.

7. The process of claim 6 in which the oxidant gas is selected from the group consisting of oxygen and water vapor.

8. The process of claim 7 in which the oxidant gas is water vapor.

9. The process of claim 8 in which the pressure of bromine gas is between 1 and 10 mTorrs and the pressure of water vapor is between 0.1 and 2 mTorrs.

10. The process of claim 9 in which the first III-V semiconductor compound is gallium arsenide and the second III-V semiconductor compound comprises gallium aluminum arsenide with at least 10 mole percent aluminum.

11. The process of claim 9 in which the first III-V semiconductor compound is indium arsenide and the second III-V semiconductor compound comprises aluminum indium arsenide or gallium indium arsenide.

12. The process of claim 1 in which the etchant gas consists essentially of bromine.

* * * * *